(12) United States Patent
Obradovic et al.

(10) Patent No.: US 7,727,838 B2
(45) Date of Patent: Jun. 1, 2010

(54) METHOD TO IMPROVE TRANSISTOR TOX USING HIGH-ANGLE IMPLANTS WITH NO ADDITIONAL MASKS

(75) Inventors: Borna Obradovic, McKinney, TX (US); Shashank S. Ekbote, Allen, TX (US)

(73) Assignee: Texas Instruments Incorporated, Dallas, TX (US)

(*) Notice: Subject to any disclaimer, the term of this patent is extended or adjusted under 35 U.S.C. 154(b) by 0 days.

(21) Appl. No.: 11/829,181

(22) Filed: Jul. 27, 2007

(65) Prior Publication Data

US 2009/0029516 A1 Jan. 29, 2009

(51) Int. Cl.
*H01L 21/00* (2006.01)

(52) U.S. Cl. ........................ 438/257; 438/267; 438/286; 438/300; 438/303; 438/305; 257/E21.039; 257/E21.041; 257/E21.345; 257/E21.629; 257/E29.04; 257/E29.013; 257/E29.054; 257/E29.262; 257/E21.346

(58) Field of Classification Search ................. 438/174, 438/185, 176, 199, 257, 258, 275, 286, 299–306, 438/525, 589, 700, 703, 705; 257/E21.039, 257/41, 345, 346, 427, 629, 637, E29.04, 257/13, 54, 63, 262, 269, E27.08

See application file for complete search history.

(56) References Cited

U.S. PATENT DOCUMENTS

| | | | | |
|---|---|---|---|---|
| 5,158,901 A * | 10/1992 | Kosa et al. | ................... | 438/300 |
| 5,427,963 A * | 6/1995 | Richart et al. | ................ | 438/257 |
| 5,459,085 A * | 10/1995 | Pasen et al. | .................. | 438/302 |
| 5,686,324 A * | 11/1997 | Wang et al. | .................. | 438/231 |
| 5,827,747 A * | 10/1998 | Wang et al. | .................. | 438/199 |
| 5,933,716 A | 8/1999 | Hashimoto | | |
| 5,976,937 A | 11/1999 | Rodder et al. | | |
| 6,008,094 A * | 12/1999 | Krivokapic et al. | ......... | 438/286 |
| 6,022,778 A | 2/2000 | Contiero et al. | | |
| 6,127,236 A * | 10/2000 | Prall et al. | ................... | 438/316 |
| 6,391,754 B1 * | 5/2002 | Paranjpe | ..................... | 438/592 |
| 6,635,542 B2 * | 10/2003 | Sleight et al. | ............... | 438/311 |
| 6,787,406 B1 * | 9/2004 | Hill et al. | ..................... | 438/164 |
| 6,849,492 B2 * | 2/2005 | Helm et al. | ................. | 438/217 |
| 6,890,832 B1 * | 5/2005 | Kerwin et al. | ............... | 438/425 |
| 6,946,353 B2 * | 9/2005 | Tran | ........................... | 438/302 |
| 7,208,397 B2 * | 4/2007 | Feudel et al. | ............... | 438/525 |
| 7,297,581 B1 * | 11/2007 | Hill et al. | .................... | 438/176 |
| 7,449,386 B2 * | 11/2008 | Lin et al. | .................... | 438/302 |
| 2005/0020022 A1 * | 1/2005 | Grudowski | ................. | 438/305 |
| 2007/0032085 A1 * | 2/2007 | Lee et al. | .................... | 438/700 |

* cited by examiner

*Primary Examiner*—Michael S Lebentritt
(74) *Attorney, Agent, or Firm*—Warren L. Franz; Wade J. Brady III; Frederick J. Telecky, Jr.

(57) ABSTRACT

A method of forming an integrated circuit includes forming a gate structure over a semiconductor body, and forming a shadowing structure over the semiconductor body laterally spaced from the gate structure, thereby defining an active area in the semiconductor body therebetween. The method further includes performing an angled implant into the gate structure, wherein the shadowing structure substantially blocks dopant from the angled implant from implanting into the active area, and performing a source/drain implant into the gate structure and the active area.

33 Claims, 3 Drawing Sheets

METHOD TO IMPROVE TRANSISTOR TOX USING HIGH-ANGLE IMPLANTS WITH NO ADDITIONAL MASKS

FIELD OF INVENTION

The present invention relates generally to semiconductor devices and more particularly to transistor devices and fabrication methods for making the same.

BACKGROUND OF THE INVENTION

Field effect transistors (FETs) are widely used in the electronics industry for switching, amplification, filtering, and other tasks related to both analog and digital electrical signals. Most common among these are metal-oxide-semiconductor field-effect transistors (MOSFETs), wherein a gate electrode is energized to create an electric field in a channel region of a semiconductor body, by which electrons are allowed to travel through the channel between a source region and a drain region of the semiconductor body. The source and drain regions are typically formed by adding dopants to targeted regions on either side of the channel. A gate dielectric or gate oxide is formed over the channel, and a gate electrode or gate contact is formed over the gate dielectric. The gate dielectric and gate electrode layers are then patterned to form a gate structure overlying the channel region of the substrate.

Conventionally, upon patterning a polysilicon gate electrode, the doping of the polysilicon is performed concurrently with the formation of the source/drains on opposing sides of the gate electrode in the semiconductor body. Typically, heavy doping at this stage is desirable in order to avoid poly depletion and thus keep Tox as small as possible. However, too much doping in the source/drain regions can lead to overrun of the extension regions, and lead undesirably to punchthrough and/or leakage.

SUMMARY OF THE INVENTION

The following presents a simplified summary in order to provide a basic understanding of one or more aspects of the invention. This summary is not an extensive overview of the invention, and is neither intended to identify key or critical elements of the invention, nor to delineate the scope thereof. Rather, the primary purpose of the summary is to present some concepts of the invention in a simplified form as a prelude to the more detailed description that is presented later.

In one embodiment, the invention is directed to a method of fabricating a transistor. The method comprises forming a gate structure over a semiconductor body, and forming a shadowing structure over the semiconductor body laterally spaced from the gate structure, thereby defining an active area in the semiconductor body therebetween. The method further comprises performing an angled implant into the gate structure, wherein the shadowing structure substantially blocks dopant from the angled implant from implanting into the active area, and performing a source/drain implant into the gate structure and the active area.

The following description and annexed drawings set forth in detail certain illustrative aspects and implementations of the invention. These are indicative of but a few of the various ways in which the principles of the invention may be employed.

DETAILED DESCRIPTION OF THE INVENTION

Figure 1:
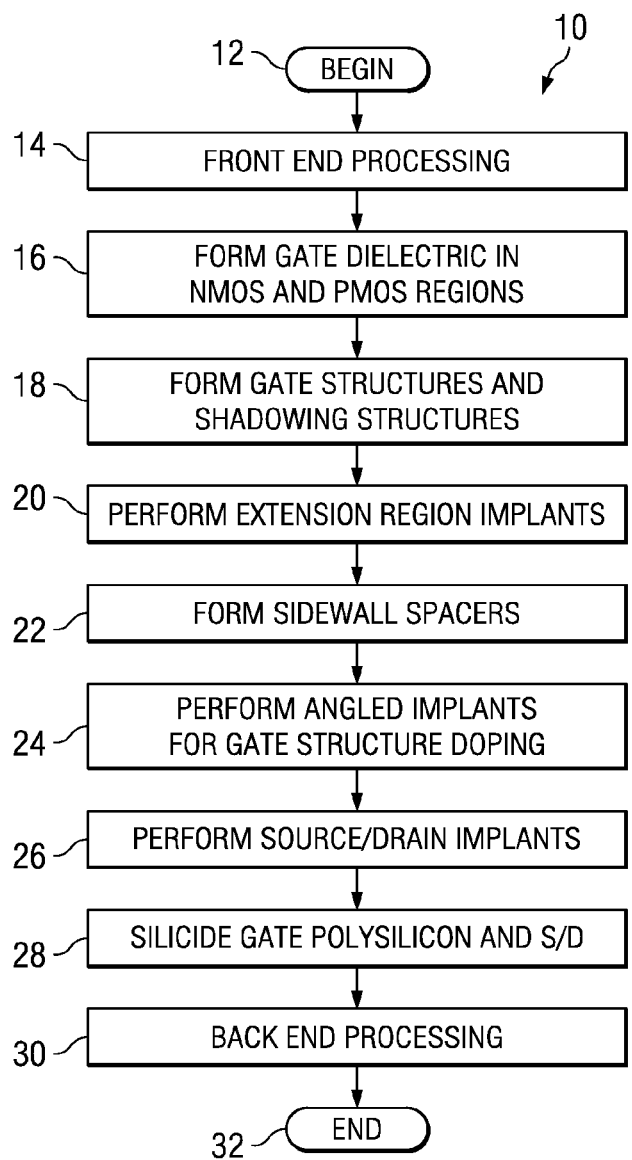
FIG. 1 is a simplified flow diagram illustrating a method of forming a transistor according to one aspect of the invention.

One or more implementations of the present invention will now be described with reference to the attached drawings, wherein like reference numerals are used to refer to like elements throughout, and wherein the illustrated structures are not necessarily drawn to scale. The invention relates to a method of forming a transistor, wherein a shadowing structure is employed to block dopant from an angled implant from reaching, in any substantial quantity, the active area neighboring a transistor gate. Consequently the angled implant operates to dope at least a portion of a gate electrode of the transistor. Source/drain regions are formed in a separate process operation, wherein the gate electrode is also concurrently doped. The method facilitates sufficient doping of the gate electrode to minimize poly depletion while avoiding excess doping in the source/drain regions without requiring an additional mask.

Turning now to the figures, FIG. 1 is a flow chart diagram illustrating a method of forming a transistor, as designated at reference numeral 10. Although the method 10 is illustrated and described below as a series of acts or events, it will be appreciated that the present invention is not limited by the illustrated ordering of such acts or events. For example, some acts may occur in different orders and/or concurrently with other acts or events apart from those illustrated and/or described herein, in accordance with the invention. In addition, not all illustrated steps may be required to implement a methodology in accordance with the present invention. Furthermore, the methods according to the present invention may be implemented in association with the devices and systems illustrated and described herein as well as in association with other structures not illustrated.

Beginning at 12, front end processing proceeds at 14, wherein such processing may include, for example, isolation processing such as shallow trench isolation (STI) formation, n-well and p-well formation, channel engineering implants, as well as other processing operations, in one embodiment. A gate dielectric is formed in active areas in NMOS and PMOS regions at 16. In one embodiment the gate dielectric comprises a silicon oxide formed by thermal oxidation, while in another embodiment the gate dielectric comprises one or more high-k dielectric materials formed by chemical vapor deposition (CVD) or other formation process. Any gate dielectric may be employed and is contemplated as falling within the scope of the invention.

At 18 gate structures and shadowing structures are formed. In one embodiment both the gate structures and shadowing structures are formed concurrently, for example, by depositing a polycrystalline silicon layer over the gate dielectric, and then patterning the layer using a patterned photoresist or other mask. In another embodiment the shadowing structure is formed in a separate processing operation, however, such an option may require an additional masking step.

Figure 2A:
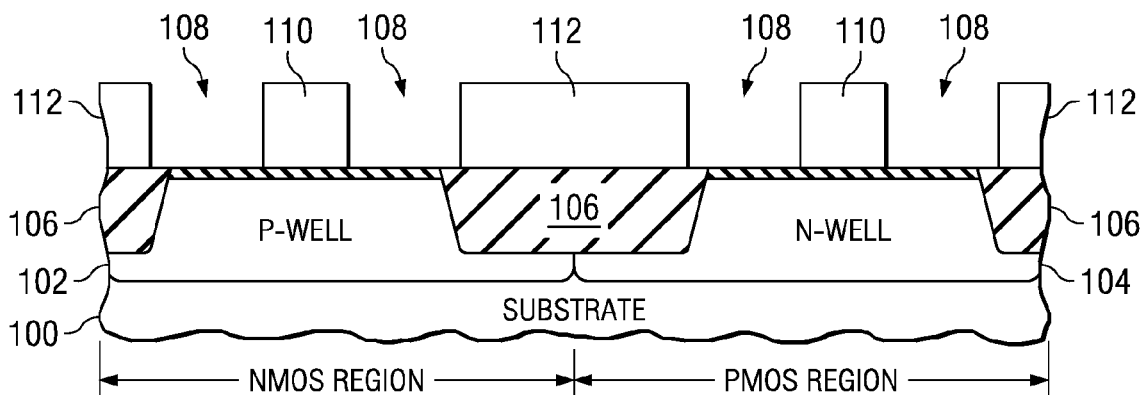
FIGS. 2A-2G are partial side elevation views in section illustrating exemplary transistors undergoing processing in accordance with an aspect of the invention at various stages of fabrication.

FIG. 2A illustrates an example of a cross-section according to one embodiment of the invention. FIG. 2A includes a semiconductor body such as a substrate 100 having a p-well 102 and an n-well 104 separated by isolation regions 106 such as STI. The p-well 102 and n-well 104 define an NMOS region and a PMOS region, respectively, in those instances where CMOS circuitry is to be employed, while the isolation regions 106 define active areas 108 therebetween.

Still referring to FIG. 2A, gate structures 110 and shadowing structures 112 are shown overlying the semiconductor body 100. In one embodiment the gate structures 110 are formed of a conductive gate electrode material such as polycrystalline silicon, and are patterned to reside over the active areas and define channel regions in the respective underlying wells 102 and 104. In the example of FIG. 2A, the shadowing structures 112 are dummy gate structures formed concurrently with the gate structures 110. In the above manner the shadowing structures 112 advantageously do not require any additional masking steps. In the example of FIG. 2A, the shadowing structures 112 are formed near the gate structures 110 on the isolation regions 106, however, in alternative embodiments they may overlie active areas. In some instances, neighboring gate structures 110 may act as a shadowing structure for one another, as will be further appreciated below.

As will be discussed in greater detail infra, the shadowing structures 112 are located local to and laterally spaced from the gate structures to provide a shadowing effect for a subsequent angled implant. Therefore, as may be appreciated, the closeness of a shadowing structure 112 to a gate structure 110 is a function of, inter alia, the angle of the subsequent angled implant and the height of the shadowing structure.

Figure 2B:
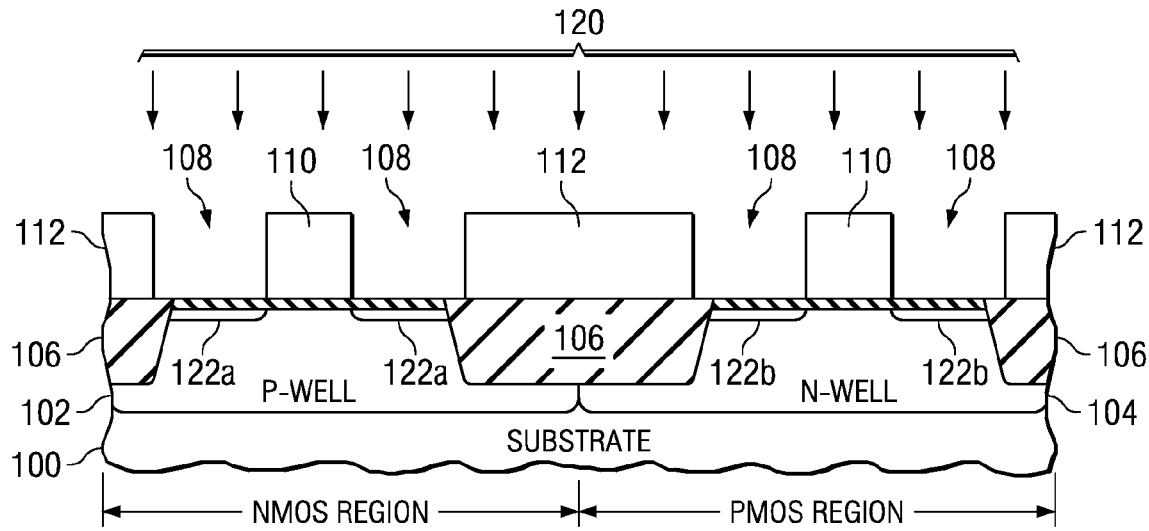

Returning to FIG. 1, the method 10 continues at 20 with the formation of extension regions, for example, via implantation. As illustrated in FIG. 2B, an implant 120 is shown generically to show formation of extension regions 122 in exposed active areas. As will be appreciated, however, the extension regions 122 in the NMOS and PMOS regions are different and are performed separately with masking steps (not shown). For example, NMOS n-type extension regions 122a are formed with an n-type implant into the p-well 102 while the PMOS region is covered with a mask. Similarly, PMOS p-type extension regions 122b are formed with a p-type implant into the n-well 104 while the NMOS region is covered with a mask. Further, although the formation of the extension regions is discussed as being done together, they may be formed at other times in the fabrication process, and all such alternatives are contemplated as falling with the scope of the invention. In addition, while not illustrated in FIG. 2B, a thin offset spacer such as an oxide or other dielectric material may be formed on lateral sidewalls of the gate structures 110 prior to the extension region formation. Further, the offset spacers may also be formed concurrently on lateral sidewalls of the shadowing structures 112 in one embodiment.

Figure 2C:
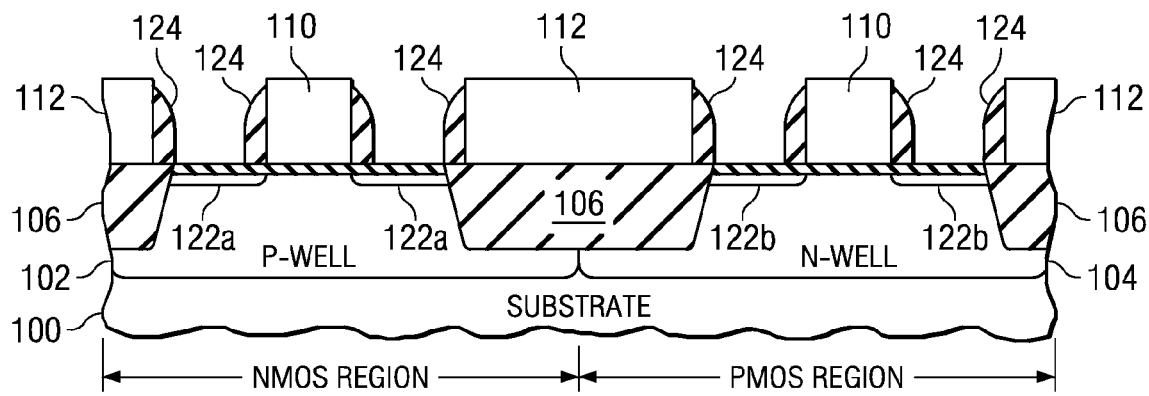

Returning to FIG. 1, the method 10 continues with the formation of sidewall spacers at 22. In one embodiment the sidewall spacers comprise a dielectric material such as a silicon nitride and are formed by a substantially conformal deposition via CVD, for example, followed by a substantially anisotropic etch (e.g., a dry etch). Resultant sidewall spacers are thus formed on lateral sidewalls of the gate structures 110 and shadowing structures 112, as illustrated in FIG. 2C at 124. In one embodiment of the invention, the location and size of the shadowing structures 112 are such that the resultant sidewall spacers formed thereon do not overlie active areas, however, such spacing and sizing is not necessarily required.

Figure 2D:
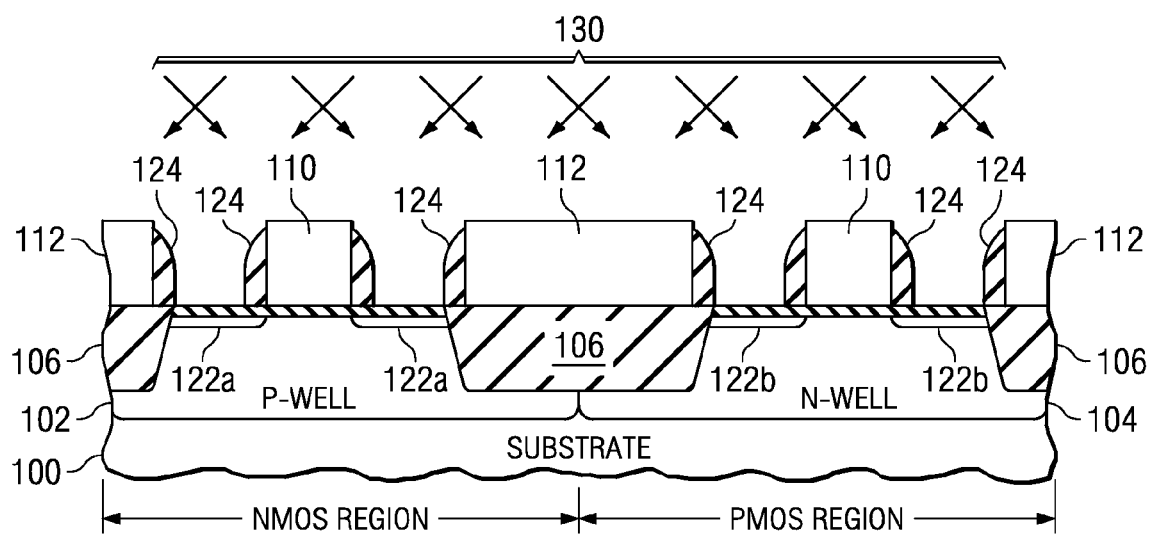

Following the formation of sidewall spacers 124, an angled implant is performed at 24 of FIG. 1 to dope the gate structures 110 without substantially affecting the active areas 108, as illustrated in FIG. 2D at reference numeral 130. According to one embodiment of the invention, the shadowing structures 112 operate to substantially block the dopant of the angled implant from reaching the active areas 108. While the shadowing structures 112 cannot guarantee that absolutely no dopant will reach the active areas 108, since scattering and other effects may cause some dopant to land therein, the shadowing structures 112 block the vast majority of dopant so that the dopant of the angled implant 130 lands primarily in the gate structures 110, thereby advantageously reducing a resistivity associated therewith. In one embodiment, the location of the shadowing structures 112 is designed to block substantially all the angled implant dopant from reaching the active areas 108. Alternatively, the shadowing structures 112 may be configured to merely reduce an amount of dopant reaching the active areas 108.

It should be understood that the angled implant dopant is the same conductivity type as that employed for the source/drain regions of the respective transistor device. That is, for an NMOS device the angled implant and source/drain implant are both an n-type dopant. Similarly, for a PMOS type device both the angled implant and the source/drain implant are p-type implants. This distinguishes the angled implant of the present invention from a conventional halo or pocket implant that employs an opposite conductivity type dopant than used for the respective source/drain. In one embodiment of the invention, the angle of the angled implant is about 55 degrees or greater (measured from an angle normal to the semiconductor body surface), wherein pocket or halo implants are typically at an angle of about 20-30 degrees.

In addition, in one embodiment a relative dose of the angled implant compared to conventional halo or pocket implants is greater by about two orders of magnitude. In one embodiment, the angled implant of the present invention is about $1E15$ ions/cm$^2$ compared to a conventional halo or pocket implant of about $1E13$ ions/cm$^2$. Further still, the energies employed in the angled implant of the present invention differ from the halo or pocket implants due to their desired function. For example, in one embodiment the angled implant of the invention has an energy in the range of about 1-5 keV (depending on the dopant species), whereas a conventional halo or pocket implant has an energy in the range of about 10-50 keV due to the differing target depths of the implants.

Figure 2E:
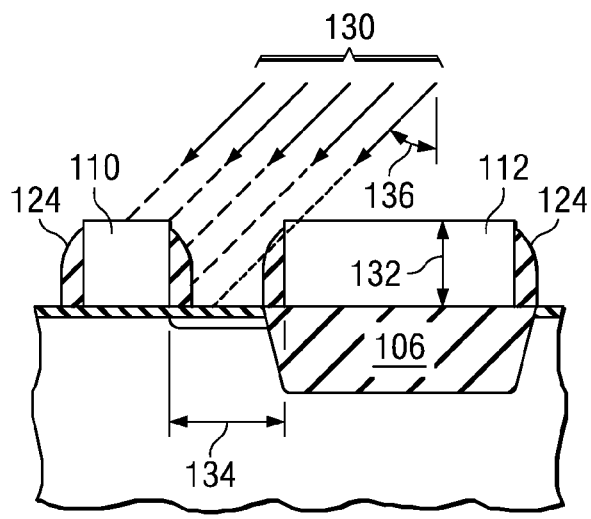

This feature is more clearly illustrated in FIG. 2E. Note that several factors may affect an amount of shadowing provided by the shadowing structures 112. For example, as illustrated in FIG. 2E, a height 132 of the shadowing structure 112 will affect an amount of shadowing. In one embodiment of the invention, the shadowing structure 112 is formed concurrently with the gate structure 110, and thus has a height that may be dictated by a desired gate structure height. In alternative embodiments, however, the shadowing structure 112 may be formed separately and its height 132 may be tuned to provide a desired amount of shadowing. Further, as illustrated in FIG. 2E, a distance 134 between the shadowing structure 112 and the gate structure 110 will affect an amount of shadowing for a given shadowing structure height 132. Lastly, the angle 136 of the angled implant 130 will affect an amount of shadowing for a given shadowing structure height 132 and distance 134 from the gate structure 110. As may be appreciated, the variables 132, 134, and 136 may be varied in differing amounts to tailor an amount of shadowing in various embodiments of the invention, and all such variations are contemplated as falling within the scope of the invention.

While FIG. 2D illustrates an angled implant 130 occurring in both NMOS and PMOS regions concurrently, it should be noted that in one embodiment of the invention, the angled implant comprises two angled implants, wherein in each case one of the NMOS and PMOS regions is appropriately masked. For example, in one embodiment, the PMOS region is masked, and an n-type angled implant 130 is performed, thereby causing the n-type dopant to implant into the NMOS region gate structures 110, while shadowing structures 112 in the NMOS region cause such dopant to not substantially reach the exposed active areas 108. Further, in performing an angled implant in the PMOS region, the NMOS region is masked, and the dopant of the angled p-type implant reaches the PMOS gate structures, thereby causing such gate structures to be implanted with p-type dopant, while the shadowing structures 112 in the PMOS region cause such dopant to not substantially reach the exposed active areas 108.

Figure 2F:
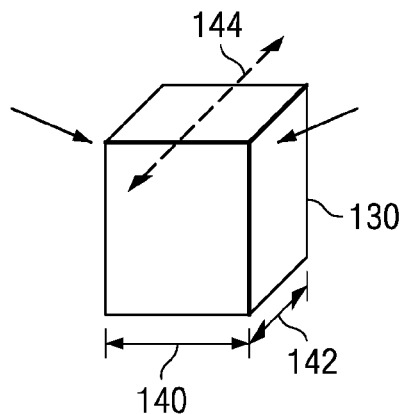

Turning now to FIG. 2F, a three dimensional figure illustrates a gate structure 110, and a shadowing structure 112 is similarly oriented with respect to the gate structure. FIG. 2F also illustrates an example of the angled implant 130 with respect to the orientation of the gate structure 110. As illustrated, the gate structure has a length 140 that corresponds to a channel length thereunder in the semiconductor body. The gate structure 110 also has a width 142 that extends along a longitudinal axis or direction 144. As illustrated in FIG. 2F, the angled implant 130 is performed in a direction that is transverse to the longitudinal direction 144 of the gate structure 110 and shadowing structure 112. In the above manner, the shadowing structure 112 operates to block dopant associated with the angled implant 130 from reaching the active areas 108 located between the shadowing structure and gate structure 110.

Figure 2G:
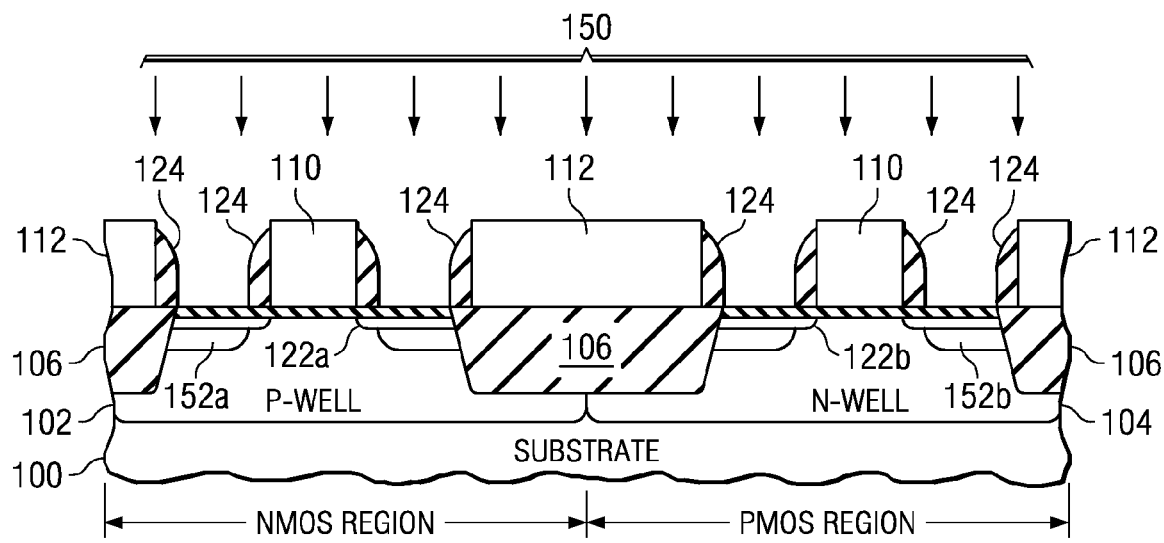

Following the angled implant 24 of FIG. 1, the method 10 continues with the formation of source/drain regions at 26, as illustrated in FIG. 2G at 152a and 152b. In one embodiment of the invention, such source/drain regions are formed via implantation 150, however, any manner of forming the source/drain regions may be employed and is contemplated as falling within the scope of the invention. Note that the source/drain implant 150 also causes additional dopant to reach the gate structures 110, thereby further reducing the resistivity associated therewith. As highlighted supra, while the source/drain formation in FIG. 2G shows the source/drain regions 152a, 152b as forming concurrently, it should be appreciated that such formation occurs in separate processing operations, wherein NMOS n-type source/drain regions 152a are formed while the PMOS region is masked off, while PMOS p-type source/drain regions 152b are formed while the NMOS region is masked off.

While acts 24 and 26 are illustrated in FIG. 1 as separate acts, wherein angled implants are performed in NMOS and PMOS regions prior to the source/drain formation, it should be understood that in one embodiment of the invention, the NMOS regions are processed using an angled implant followed by a source/drain implant while the PMOS region is masked off. Similarly, the PMOS regions are processed in one embodiment using an angled implant followed by a source/drain implant while the NMOS region is masked off. Further, while in one embodiment the angled implant in a region is performed prior to the formation of the source/drain region, in another embodiment the source/drain regions may be formed first, followed by an angled implant. Any ordering of such acts may be performed and all such variations are contemplated as falling within the scope of the present invention.

In the above embodiment the source/drain implant is substantially normal to the surface of the semiconductor body, however, in alternative embodiments, the source/drain implant may be performed at some angle with respect to normal and such alternatives are contemplated as falling within the scope of the present invention. In such alternative embodiments, the angled implant is performed at a first angle, while the source/drain implant is performed at a second angle, wherein the first angle is larger than the second angle, as measured with respect to a plane normal to the surface of the semiconductor body.

Returning to FIG. 1, the method 10 continues at 28 with silicidation processing, wherein a metal such as nickel or cobalt, for example, are deposited and subjected to thermal processing. The temperature causes the metal to react with silicon in the source/drain and gate regions, and then unreacted metal is stripped away, for example, using a wet etch. The method 10 then concludes at 30 with back end processing that includes metallization processing to interconnect various components of the integrated circuit, as may be appreciated.

In the examples provided above, the shadowing structure 112 acts as a dummy gate structure. That is, while they are formed concurrently with the gate structures, they do not result in a transistor or other type active component. In an alternative embodiment of the invention, a shadowing structure may comprise an active component on the semiconductor body, and such alternatives are contemplated as falling within the scope of the invention. For example, in one embodiment multiple transistor devices may be formed within a single active area 108. In such an instance, a neighboring gate structure may functionally operate as a shadowing structure, wherein an angled implant dopes the gate while being substantially shielded from active areas between the gate structures by the gate structures themselves. Therefore the present invention contemplates the use of gate structures as shadowing structures, and such an alternative is contemplated as falling within the scope of the invention.

According to the invention, the angled implants 130 allow the gate structures 110 to receive additional dopant that helps reduce the negative impact of poly depletion in the formation of transistors. Further, since the angled implant is substantially prevented from reaching the active areas 108 due to the action of the shadowing structures 112, the additional gate structure dopant does not adversely affect the source/drain regions 152. Consequently, the present invention provides for an improvement in transistor performance without requiring additional masking steps.

Although the invention has been illustrated and described with respect to one or more implementations, alterations and/or modifications may be made to the illustrated examples without departing from the spirit and scope of the appended claims. In particular regard to the various functions performed by the above described components or structures (assemblies, devices, circuits, systems, etc.), the terms (including a reference to a "means") used to describe such components are intended to correspond, unless otherwise indicated, to any component or structure which performs the specified function of the described component (e.g., that is functionally equivalent), even though not structurally equivalent to the disclosed structure which performs the function in the herein illustrated exemplary implementations of the invention. In addition, while a particular feature of the invention may have been disclosed with respect to only one of several implementations, such feature may be combined with one or more other features of the other implementations as may be desired and advantageous for any given or particular application. Furthermore, to the extent that the terms "including", "includes", "having", "has", "with", or variants thereof are used in either the detailed description and the claims, such terms are intended to be inclusive in a manner similar to the term "comprising".

What is claimed is:

1. A method of forming an integrated circuit, comprising:
    forming a gate structure over an active area of a semiconductor body;
    forming a shadowing structure over the semiconductor body laterally spaced from the gate structure;
    performing an angled implant of a first conductivity type at a first angle into the gate structure, wherein the shadowing structure substantially blocks dopant from the angled implant from implanting into the active area; and
    performing a source/drain implant of the first conductivity type at a second angle into the gate structure and into the active area, wherein the first angle is greater than the second angle.

2. The method of claim 1, wherein the shadowing structure comprises another gate structure.

3. The method of claim 1, wherein the gate structure comprises a gate electrode overlying a gate dielectric; wherein performing the angled implant comprises performing the angled implant into the gate electrode at the first angle; and wherein performing the source/drain implant comprises performing the source/drain implant into the gate electrode at the second angle.

4. The method of claim 1, wherein the first angle is at least 55 degrees from a normal to a surface of the active area of the semiconductor body; and the second angle is substantially normal to the surface of the active area of the semiconductor body.

5. The method of claim 1, wherein the source/drain implant is performed as a next process step after the angled implant.

6. A method of forming an integrated circuit, comprising:
    forming a gate structure over an active area of a semiconductor body, the gate structure extending in a longitudinal direction;
    forming a shadowing structure laterally spaced from the gate structure in a direction transverse to the longitudinal direction;
    performing an angled implant of a first conductivity type into the gate structure at a first angle in a direction transverse to the longitudinal direction, wherein the shadowing structure substantially blocks dopant from the angled implant from implanting into the active area; and
    performing a source/drain implant of the first conductivity type at a second angle into the gate structure and into the active area, wherein the first angle is greater than the second angle.

7. The method of claim 6, wherein the transverse direction of the angled implant is substantially perpendicular to the longitudinal direction.

8. The method of claim 6, wherein the shadowing structure comprises a gate structure formed over the semiconductor body.

9. The method of claim 6, wherein the shadowing structure comprises a gate electrode feature overlying an isolation region associated with the semiconductor body.

10. The method of claim 6, wherein the shadowing structure resides on a first side of the gate structure, the method further comprising forming another shadowing structure on a second, opposite side of the gate structure.

11. The method of claim 10, further comprising performing another angled implant directed toward the second side of the gate structure in a direction transverse to the longitudinal direction, wherein the another shadowing structure substantially blocks dopant from the another angled implant from implanting into the active area of the semiconductor body on the second side of the gate structure.

12. The method of claim 6, further comprising forming sidewall spacers on sidewalls of the gate structure prior to the angled implant, wherein the angled implant results in doping reaching a top portion of the gate structure.

13. The method of claim 6, wherein the source/drain implant is performed after the angled implant.

14. A method of forming an integrated circuit, comprising:
    concurrently forming a gate structure and a shadowing structure over a semiconductor body, wherein the shadowing structure is spaced laterally from the gate structure, and the gate structure being formed over an active area in the semiconductor body;
    forming an extension region in the active area;
    forming sidewall spacers on lateral edges of the gate structure;
    performing an angled implant of a first conductivity type at a first angle into the gate structure, wherein the shadowing structure substantially blocks dopant from the angled implant from implanting into the active area; and
    performing a source/drain implant of the first conductivity type at a second angle into the gate structure and into the active area, wherein the first angle is greater than the second angle.

15. The method of claim 14, wherein the first angle is at least 55 degrees from a normal to a surface of the active area of the semiconductor body; and the second angle is substantially normal to a surface of the active area of the semiconductor body.

16. The method of claim 14, wherein a width portion of the gate structure extends in a longitudinal direction, and wherein the angled implant is in a direction transverse to the longitudinal direction.

17. The method of claim 16, wherein the transverse direction of the angled implant is substantially perpendicular to the longitudinal direction.

18. The method of claim 14, wherein the shadowing structure comprises a gate structure formed over the semiconductor body.

19. The method of claim 14, wherein the shadowing structure comprises a gate electrode feature overlying an isolation region associated with the semiconductor body.

20. The method of claim 1, wherein forming the gate structure comprises forming a first gate structure having a first height and including a gate electrode; forming the shadowing structure comprises forming a second gate structure having a second height and being laterally spaced from the first gate structure; performing the angled implant comprises performing the angled implant into the gate electrode at the first angle, wherein the angle of the angled implant, first and second heights, and spacing of the first and second gate structures substantially blocks dopant from the angled implant from implanting into the active area; and performing the source/drain implant comprises performing the source/drain implant at a second angle into the gate electrode and into the active area.

21. The method of claim 20, wherein the second gate structure comprises a dummy gate structure.

22. The method of claim 21, wherein the active region is a region bounded by an isolation region; and the second gate structure is formed over the isolation region.

23. The method of claim 20, wherein the first angle is at least 55 degrees from a normal to a surface of the active area of the semiconductor body; and the second angle is substantially normal to the surface of the active area of the semiconductor body.

24. The method of claim 20, wherein the gate structure comprises polycrystalline silicon.

25. The method of claim 1, wherein the gate structure and shadowing structure are formed concurrently by forming a dielectric layer over the semiconductor substrate; depositing a polycrystalline silicon layer over the gate dielectric layer; and patterning the deposited polycrystalline silicon and gate dielectric layer.

26. A method of forming an integrated circuit, comprising:
forming gate structures of given height and spacing over a semiconductor body, the gate structures including gate electrodes;
performing a first implant at a first angle to implant dopant of a first conductivity type into the gate electrodes, the first angle acting with the given height and spacing of the gate structures so that neighboring gate structures shadow one another to substantially block dopant from implanting into the semiconductor body; and
performing a second implant at a second angle to implant dopant of the first conductivity type into the gate structures and into the semiconductor body to form source/drain regions.

27. The method of claim 26, wherein the gate electrodes comprise polycrystalline silicon.

28. The method of claim 26, wherein the first angle is at least 55 degrees from a normal to a surface of the semiconductor body; and the second angle is substantially normal to the surface of the semiconductor body.

29. The method of claim 26, wherein the semiconductor body has active regions separated by isolation structures; the gate structures comprise first gate structures formed over respective active regions and second gate structures formed over respective isolation structures.

30. The method of claim 26, wherein the first implant provides a dopant dose of about 1E15 ions/cm$^2$ at an implant energy in a range of about 1-5 keV.

31. A method of forming an integrated circuit, comprising:
forming gate structures of given height and spacing over respective active regions separated by isolation structures in a semiconductor body;
performing a first implant at a first angle to implant dopant of a first conductivity type into the gate structures, the first angle acting with the given height and spacing of the gate structures so that neighboring gate structures shadow one another to substantially block dopant from implanting into the active regions; and
performing a second implant at a second angle to implant dopant of the first conductivity type into the gate structures and into the active regions to form source/drain regions adjacent the gate structures.

32. The method of claim 31, wherein the active regions comprise NMOS regions and PMOS regions; performing the first implant comprises performing a first n-type implant with PMOS regions masked, and performing a first p-type implant with NMOS regions masked; and performing the second implant comprises performing a second n-type implant with PMOS regions masked, and performing a second p-type implant with NMOS regions masked.

33. The method of claim 31, wherein the gate structures have widths extending in a longitudinal direction and the first implant is performed in a direction that is transverse to the longitudinal direction.

\* \* \* \* \*